United States Patent
Milke et al.

(10) Patent No.: US 11,982,353 B2
(45) Date of Patent: May 14, 2024

(54) DEVICE WITH A HOUSING HAVING HOUSING PARTS

(71) Applicant: TDK Electronics AG, Munich (DE)

(72) Inventors: Bettina Milke, Berlin (DE); Andreas Breuer, Berlin (DE)

(73) Assignee: TDK Electronics AG, Munich (DE)

( * ) Notice: Subject to any disclaimer, the term of this patent is extended or adjusted under 35 U.S.C. 154(b) by 0 days.

(21) Appl. No.: 17/630,452

(22) PCT Filed: Mar. 24, 2021

(86) PCT No.: PCT/EP2021/057597
§ 371 (c)(1),
(2) Date: Jan. 26, 2022

(87) PCT Pub. No.: WO2021/197965
PCT Pub. Date: Oct. 7, 2021

(65) Prior Publication Data
US 2022/0252158 A1  Aug. 11, 2022

(30) Foreign Application Priority Data

Apr. 1, 2020  (DE) .......................... 102020109059.5

(51) Int. Cl.
*F16J 15/06* (2006.01)
*F16J 15/10* (2006.01)
*H05K 5/06* (2006.01)

(52) U.S. Cl.
CPC .......... *F16J 15/064* (2013.01); *F16J 15/102* (2013.01); *H05K 5/068* (2013.01)

(58) Field of Classification Search
CPC .......... F16J 15/064; F16J 15/10; F16J 15/102; H05K 5/068
See application file for complete search history.

(56) References Cited

U.S. PATENT DOCUMENTS 3,058,232 A * 10/1962 Farkass .................. F16J 15/004
  34/92
5,516,122 A * 5/1996 Caffee ..................... F16L 23/20
  285/918

(Continued)

FOREIGN PATENT DOCUMENTS

CN  202697094 U  1/2013
DE  3938782 A1  5/1991

(Continued)

OTHER PUBLICATIONS

Sturm P. et al., "Permeation of atmospheric gases through polymer O-rings used in flasks for air sampling," Journal of Geophys. Research Atmospheres, 109, D04309, Feb. 2004, 10 pages.

*Primary Examiner* — Gilbert Y Lee
(74) *Attorney, Agent, or Firm* — Slater Matsil, LLP

(57) ABSTRACT

In an embodiment a device includes a housing with at least a first housing part, a second housing part and an interior space at least partially surrounded by the first and second housing parts and a sealing element, wherein the first housing part includes a first sealing surface and the second housing part includes a second sealing surface, wherein the sealing element abuts the first sealing surface and the second sealing surface, wherein the sealing element has an inner surface in contact with the interior space and an outer surface in contact with a surrounding atmosphere of the housing, and wherein the sealing element includes a material through which gas is exchangeable between the interior space and the surrounding atmosphere.

18 Claims, 2 Drawing Sheets

(56) References Cited

U.S. PATENT DOCUMENTS

| | | | |
|---|---|---|---|
| 5,914,154 | A | 6/1999 | Nemser |
| 6,520,020 | B1 | 2/2003 | Lutz et al. |
| 6,715,772 | B1 * | 4/2004 | Micciche ............ B05B 11/0044 |
| | | | 277/650 |
| 7,464,968 | B2 * | 12/2008 | Sakazaki ................ F16J 15/064 |
| | | | 285/236 |
| 8,821,226 | B2 | 9/2014 | Yano et al. |
| 9,360,114 | B2 * | 6/2016 | Trompenaars ........... F16J 15/32 |
| 11,083,097 | B2 | 8/2021 | Kerner et al. |
| 11,274,986 | B2 | 3/2022 | Bohl et al. |

FOREIGN PATENT DOCUMENTS

| | | | |
|---|---|---|---|
| DE | 4329980 A1 | 10/1994 | |
| DE | 19652228 A1 * | 6/1998 | ............ B60T 11/236 |
| DE | 19882417 T1 | 5/2000 | |
| DE | 202010006041 U1 * | 8/2010 | ............. F16J 15/064 |
| DE | 102010015610 A1 | 10/2011 | |
| DE | 102010053763 A1 | 6/2012 | |
| DE | 102015214923 A1 | 2/2017 | |
| DE | 102017128460 A1 | 6/2019 | |
| DE | 102021119972 A1 * | 2/2023 | .............. A47J 36/00 |
| EP | 1244899 A2 | 10/2002 | |
| KR | 101305683 B1 | 9/2013 | |
| WO | 9520020 A1 | 7/1995 | |

\* cited by examiner

DEVICE WITH A HOUSING HAVING HOUSING PARTS

This patent application is a national phase filing under section 371 of PCT/EP2021/057597, filed Mar. 24, 2021, which claims the priority of German patent application 102020109059.5, filed Apr. 1, 2020, each of which is incorporated herein by reference in its entirety.

TECHNICAL FIELD

A device is specified. In particular, the device can comprise a housing with an interior space to be protected against moisture and/or particles.

BACKGROUND

Hermetically sealed housings can be used to protect a housing interior space from moisture and particles. However, in such housings, pressure differences can occur between the internal volume and the atmospheric pressure applied outside. These are caused, for example, by temperature changes, air pressure fluctuations or a change in altitude within the atmosphere. The pressure difference can lead to deformation of the housing and to damage to its seal. If a pressure sensing sensor is installed in the housing or the housing is part of a relative pressure sensor, the pressure difference will result in a measurement error. Similarly, condensation can occur in a closed housing due to lack of ventilation.

To avoid these problems, it is common practice in the prior art to produce contact with the ambient atmosphere outside the housing with the aid of a specially inserted opening. However, this opening must be protected against the ingress of water and any other liquids and contaminants. This is typically done by a so-called pressure equalization element, which contains a semi-permeable membrane that is permeable to air but protects against the entry of liquids or particles. The pressure equalization element requires a sophisticated design so that it is not mechanically damaged or contaminated, for example, in applications in harsh environmental conditions. Likewise, the pressure compensation element must be protected from a direct water jet, for example. From the documents DE 10 2017 128 460 A1, Documents DE 10 2015 214 923 A1 and KR 101305683 B1, pressure equalization openings and pressure equalization membranes are known.

Furthermore, it is known, for example in the automotive sector, to ventilate the sensor housing of pressure sensors through the electrical connector into the connected cable or cable harness, but this can be problematic because undefined pressure conditions prevail in the cable. There is also a risk of moisture ingress through the connector.

SUMMARY OF THE INVENTION

Embodiments provide a device, in particular a device with a housing.

According to at least one embodiment, a device comprises a housing with an interior space. In the interior space, the device can comprise at least one component that is to be protected, for example, from moisture and/or particles and/or other contaminants. For example, the device can be an electrical device and comprise at least one electrical or electronic component, that is, a component with electrical or electronic functionality. In particular, the at least one electrical or electronic component can be arranged and electrically connected in the interior space. Furthermore, the device may, for example, additionally or alternatively be a chemical and/or magnetic device and comprise at least one component with a chemical and/or magnetic functionality in the interior space. Furthermore, other functionalities are also possible. The device can also comprise a combination of multiple components with different functionalities and/or at least one component with multiple functionalities.

For example, the at least one electrical or electronic component can comprise or be at least one sensor element. A property to be measured by the sensor element can particularly preferably be a pressure, so that the device can for example be configured as a pressure sensor. In this case, the sensor element can comprise or be a pressure sensor chip, for example. Furthermore, a property to be measured by the sensor element can also be, for example, a temperature, so that the device can additionally or alternatively be embodied as a temperature sensor. In this case, the sensor element can comprise or be a thermistor, for example. Furthermore, the sensor element can also be embodied as an optical sensor, for example. The device can also comprise a plurality of sensor elements, which can be selected, for example, from the described sensor elements, so that the electrical device can be used to measure multiple parameters.

Furthermore, it can also be possible that the device alternatively or additionally comprises in the interior space at least one electrical or electronic component that does not comprise a sensor function. For example, the at least one electronic component can comprise or be one or more electronic components such as an ASIC (application-specific integrated circuit). For example, an ASIC can be configured and provided to drive another electronic component such as a sensor element.

According to another embodiment, the housing comprises at least a first housing part and a second housing part. The housing parts, which can be formed in one or more parts, can in particular at least partially surround the interior space of the housing. Particularly preferably, the first and second housing parts can be joined together to form the housing, thereby forming and enclosing the interior space. Furthermore, there can be even more housing parts arranged and/or attached to the first and/or second housing part. Furthermore, it can also be the case that a component arranged in the interior space forms part of a housing wall between the interior space and the surrounding atmosphere. For example, in the case of a device configured as a pressure sensor, this can be a sensor element, for example in the form of a pressure sensor chip.

According to a further embodiment, the device comprises a sealing element arranged between the first and second housing parts. Particularly preferably, the first housing part comprises a first sealing surface and the second housing part comprises a second sealing surface, wherein the sealing element abuts the first sealing surface and the second sealing surface, respectively. In particular, the sealing element is arranged between the first and second sealing surfaces and is particularly preferably in direct mechanical contact with the first sealing surface and with the second sealing surface. Particularly preferably, the first and second sealing surfaces are arranged opposite each other as viewed from the sealing element. In particular, the sealing element is arranged in a sealing area provided for the sealing element, which is preferably delimited on two sides by the first and second sealing surfaces.

According to a further embodiment, the sealing element comprises an inner surface which is in contact with the interior space. Furthermore, the sealing element comprises an outer surface that is in contact with an atmosphere surrounding the housing. In other words, a gas atmosphere present in the interior space of the housing is adjacent to the inner surface of the sealing element, while the atmosphere surrounding the housing is adjacent to the outer surface of the sealing element. Assuming the sealing element is not present results in particular in a continuous path from the interior space to the surrounding atmosphere and vice versa. The interior space is thus spatially separated from the surrounding atmosphere by the sealing element.

The sealing element can be selected, for example, from an O-ring, a cord seal, a flat seal and an injection-molded seal. In particular, the sealing element can be used in place of a conventional gasket. The first and second sealing surfaces of the first and second housing parts can be parts of an, for example, annular sealing area in which the sealing element is arranged.

According to a further embodiment, the sealing element comprises a material through which a gas exchange takes place between the interior space and the surrounding atmosphere. In particular, this can mean that at least one gas species can penetrate the sealing element under normal operating conditions of the device and can pass from the surrounding atmosphere into the interior space and vice versa. The at least one gas species can preferably comprise or be one or more components of air. The gas exchange can particularly allow pressure equalization to occur between the interior space and the surrounding atmosphere, such that the pressure in the interior space can adjust to a changing pressure of the surrounding atmosphere. The sealing element can further be particularly preferably repellent to moisture and particles. In particular, this can mean that moisture and particles from the surrounding atmosphere are at least prevented from entering the interior space. Particularly preferably, the sealing element is impermeable to moisture and particles. The sealing element thus makes it possible to achieve pressure equalization between the surrounding atmosphere and the interior space, while protecting the interior space from moisture and contamination by particles from the surrounding atmosphere. A material suitable for this purpose for the sealing element as well as the sealing element itself can also be referred to here and in the following accordingly as semipermeable. The sealing element can thus form, in particular, a semipermeable housing sealing for equalizing the pressure in the interior space of the housing.

According to a further embodiment, the sealing element comprises or is made of a porous material. In particular, the porous material can be configured to be at least partially permeable to gases and impermeable to moisture and particles. In particular, the sealing element can comprise or be made of a plastic material. Particularly preferably, the porous material can be a porous rubber or porous polytetrafluoroethylene (PTFE), such that the sealing element can comprise or be made of a porous rubber and/or porous PTFE. For example, the rubber can be a silicone rubber, a fluororubber, or a nitrile rubber. In particular, the porosity of the sealing element can be adjusted to achieve a gas flow rate described below. Furthermore, the sealing element can comprise a non-porous gas-permeable polymer, for example as described in the document DE 198 82 417 T1, the disclosure content of which is incorporated herein by reference.

In particular, the sealing element can comprise a porous material and/or a non-porous gas-permeable material with a gas flow rate F for air of greater than or equal to 0.1 $l/(h \times cm^3)$ or of greater than or equal to 0.3 $l/(h \times cm^3)$ or of greater than or equal to 1 $l/(h \times cm^3)$. The gas flow rate F is the equilibrium gas flow rate through an object such as a membrane with an area A and a thickness d at a partial pressure difference p1−p2 and can be calculated using, for example, the formula $F = K \times [A \times (p1-p2)/d]$, as described in the document P. Sturm et al, "Permeation of atmospheric gases through polymer O-rings used in flasks for air sampling," J. Geophys. Res., 109, D04309 (2004).

According to a further embodiment, gas exchange between the interior space and the surrounding atmosphere takes place exclusively through the sealing element. In particular, this can mean that the housing is free of a ventilation opening for ventilating the interior space, as is commonly used in the prior art. Further, this can mean that if another, gas-tight material were used instead of the sealing element, the housing and thus the interior space would be hermetically sealed.

In the case of the device described herein, the problem of an additionally required ventilation opening and its protection by an elaborate pressure equalization element is thus avoided by sealing the housing by means of the sealing element described herein, which can preferably comprise or be made of a semi-permeable material that is gas-permeable similar to the operation of a pressure equalization element but repels liquids and particles. Particularly preferably, a housing seal that is required by the design can be implemented by the sealing element, in particular in the form of an O-ring, a cord seal, a flat seal or an injection-molded seal. For example, the sealing element can be embodied in accordance with the ISO 3601 standard. Particularly preferably, a semi-permeable material can be used such as a porous rubber or porous PTFE and provide pressure equalization between the interior space of the sealed housing and the surrounding atmosphere. This eliminates the need for an additional pressure equalization opening and the pressure equalization element required for this purpose. On the one hand, the sealing element ensures protection against liquids and particles and, on the other hand, preferably also has sufficient permeability for gases, in particular air, so that the sealing element assumes the function of a pressure equalization element. The porosity and thus the gas flow can be specifically controlled by the design of the sealing element, depending on the application.

If the sealing element is used instead of an ordinary seal, it can be possible that in particular no additional splash protection against water is necessary, since seals are usually installed in such a way that splash protection already exists. Furthermore, no bonding or welding is necessary for a membrane that would otherwise have to be provided as a pressure equalization element. Furthermore, it can be possible by design that the sealing element, unlike a diaphragm, cannot be lost and is safe against pressure surges and replaceable, which can provide better maintainability. In contrast, a diaphragm, as used for pressure equalization elements, would be glued or welded and thus would not be replaceable.

BRIEF DESCRIPTION OF THE DRAWINGS

Further advantages, advantageous embodiments and further developments are revealed by the exemplary embodiments described below in connection with the figures, in which.

Figure 1A:
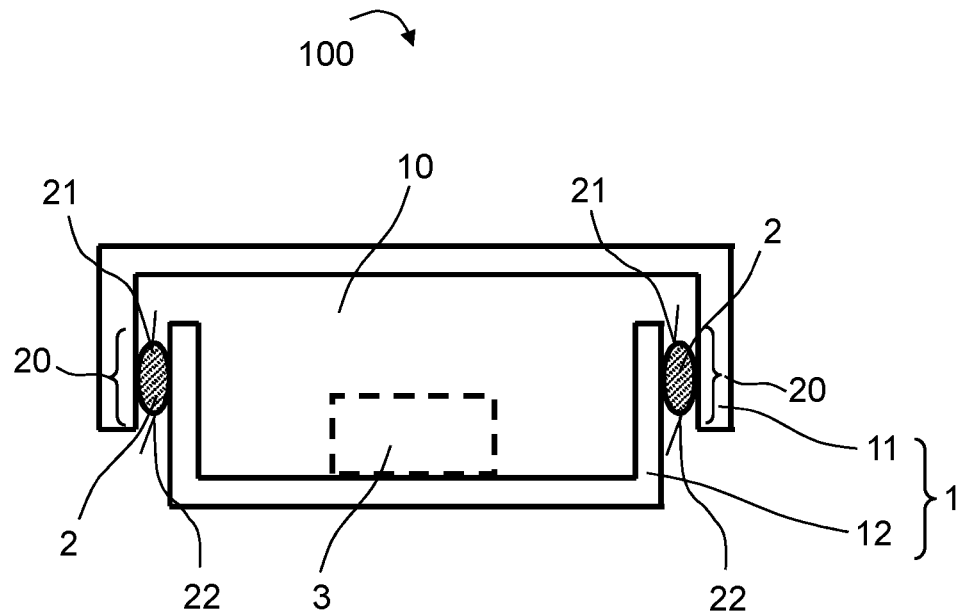
FIGS. 1A and 1B show schematic illustrations of a device in accordance with an exemplary embodiment.

In the embodiments and figures, identical, similar or identically acting elements are provided in each case with the same reference numerals. The elements illustrated and their size ratios to one another should not be regarded as being to scale, but rather individual elements, such as for example layers, components, devices and regions, can have been made exaggeratedly large to illustrate them better and/or to aid comprehension.

DETAILED DESCRIPTION OF ILLUSTRATIVE EMBODIMENTS

Figure 1B:
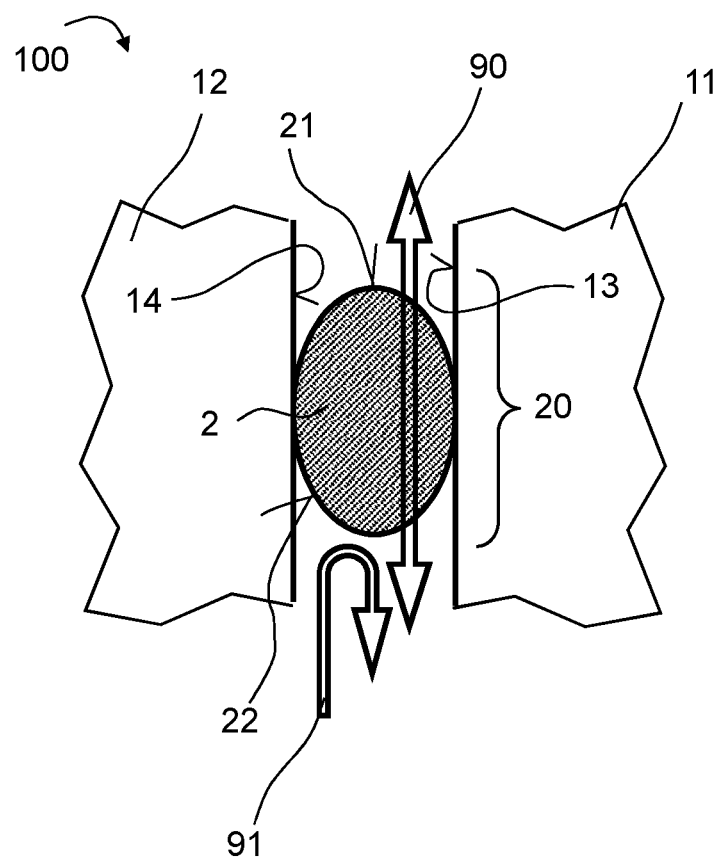

FIGS. 1A and 1B show exemplary embodiments of a device 100, wherein FIG. 1B shows a portion of the view in FIG. 1A. The following description refers equally to FIGS. 1A and 1B.

The device 100 comprises a housing 1 enclosing an interior space 10. In the interior space 10, as indicated by the dashed line, at least one component 3 can be arranged and electrically connected depending on its functionality. Purely by way of example, the device 100 is configured as an electrical device and comprises, as component 3, an electrical or electronic component which is arranged and electrically connected in the interior space 10. Alternatively or additionally, the device boo can also comprise chemical and/or magnetic and/or other functionalities and comprise one or more corresponding components. Purely by way of example, the device 100 can be a pressure sensor such as a high pressure sensor and/or a differential pressure sensor. For this purpose, the device 100, for example the housing 1, can in particular include one or more pressure feeds and electrical connections as well as other components which are not shown for the sake of clarity. The indicated component 3 in the form of an electronic component can comprise or be a sensor element, in particular a pressure sensor element in the form of a pressure sensor chip, which can for example be a silicon-based pressure sensor chip such as a piezoresistive silicon pressure sensor chip. Furthermore, the sensor element can also be formed as a capacitive ceramic pressure sensor chip, a piezoresistive thick- or thin-film-based pressure sensor chip based on metallic or ceramic bending plates, or an inductive pressure sensor chip.

In addition, one or more further electronic components, such as an ASIC (application-specific integrated circuit), can be arranged and electrically connected in the interior space 10 of the housing 1, being configured and provided, for example, to drive the sensor element.

As mentioned before, the device 100 is not limited to pressure sensors. Alternatively or in addition to the described pressure sensor application, the device 100 can also perform another function and accordingly comprise at least one other component 3.

As shown in FIG. 1A, the housing 1 comprises in particular at least a first housing part 11 and a second housing part 12 which are joined together to form the housing 1 or at least a part thereof and which surround the interior space 10. Each of the housing parts 11, 12 can be formed in one or more parts. Furthermore, there can be even more housing parts arranged and/or attached to the first and/or second housing part. Further, it can also be that the component 3 forms part of a housing wall separating the interior space 10 from the surrounding atmosphere.

A sealing element 2 is arranged in a sealing area 20 between the first and second housing parts 11, 12. For this purpose, as can be seen in FIG. 1B, the first housing part 11 comprises a first sealing surface 13 and the second housing part 12 comprises a second sealing surface 14, wherein the sealing element 2 abuts the first sealing surface 13 and the second sealing surface 14, respectively. The sealing element 2 is arranged between the first and second sealing surfaces 13, 14 and is particularly preferably in direct mechanical contact with the first sealing surface 13 and with the second sealing surface 14, wherein the first and second sealing surfaces 13, 14, viewed from the sealing element 2, are particularly preferably arranged opposite one another. The sealing area 20 can thus be delimited on two sides by the first and second sealing surfaces 13, 14.

An inner surface 21 of the sealing element 2 is in contact with the interior space 10, while an outer surface 22 is in contact with an atmosphere surrounding the housing 1. The interior space 10 is thus spatially separated from the surrounding atmosphere by the sealing element 2.

The sealing element 2 comprises a material through which a gas exchange 90 takes place between the inner space 10 and the surrounding atmosphere, as indicated by the double arrow. Accordingly, at least one gas species, in particular gases from the air, can penetrate the sealing element 2 under normal operating conditions of the device 100 and pass from the surrounding atmosphere into the interior space 10 and vice versa. Thus, pressure equalization between the interior space 10 and the surrounding atmosphere is possible, so that the pressure in the interior space 10 can adjust to a changing pressure of the surrounding atmosphere, for example due to a change in temperature.

The sealing element 2 is further configured and provided to repel moisture and particles. In particular, this can mean that the sealing element 2 is preferably at least partially or particularly preferably substantially or even completely impermeable to moisture and particles and comprises a corresponding repellency behavior 91, as indicated by the correspondingly marked arrow. This allows pressure equalization between the surrounding atmosphere and the interior space 10, while protecting the interior space 10 from moisture and contamination by particles from the surrounding atmosphere. Accordingly, the sealing element 2 forms a semi-permeable housing seal for equalizing the pressure in the interior space 10 of the housing 1 and simultaneously protecting it from moisture and contamination.

As shown in FIGS. 1A and 1B, the sealing element 2 can be embodied, for example, as an O-ring or as a cord seal. Thus, in the exemplary embodiment shown, the sealing region 20 forms a continuous annular region radially surrounding the interior space 10. Alternatively to the shown geometry of the housing parts 11, 12 and the sealing area 20, other arrangements and geometries are also possible.

The sealing element 2 comprises or is made of a porous material which is permeable to at least one gas species and is repellent, i.e. particularly preferably impermeable, to moisture and particles. In particular, the sealing element 2 can comprise or be made of a plastic. Particularly preferably, the porous material can be a porous rubber such as a silicone rubber, a fluororubber or a nitrile rubber or porous polytetrafluoroethylene (PTFE), such that the sealing element 2 can comprise or be made of a porous rubber and/or porous PTFE. Further, the sealing element 2 can also comprise a gas-permeable non-porous material as described above in the general part.

In the device 100, gas exchange between the interior space 10 and the surrounding atmosphere preferably occurs only through the sealing element 2, so that the housing 1 is free of a ventilation opening elsewhere to ventilate the interior space 10. The gas exchange 90 caused by the gas permeability and the repellency behavior 91 with respect to moisture and particles can be adjusted by a suitable choice of material for the sealing element 2, depending on the application and ambient conditions, to achieve sufficiently rapid pressure equalization while protecting the interior space 10. Pressure equalization can be required, for example, when the temperature of the environment changes. For example, an air volume of about 7 cm$^3$ undergoes a volume change of about 0.14 cm$^3$ when the temperature changes from 20° C. to 80° C., which would cause a corresponding pressure change in a hermetically sealed interior space. It has been found to be advantageous if the sealing element 2 comprises a gas flow rate of greater than or equal to 0.1 l/(h×cm$^3$) or of greater than or equal to 0.3 l/(h×cm$^3$) or of greater than or equal to 1 l/(h×cm$^3$).

Figure 2A:
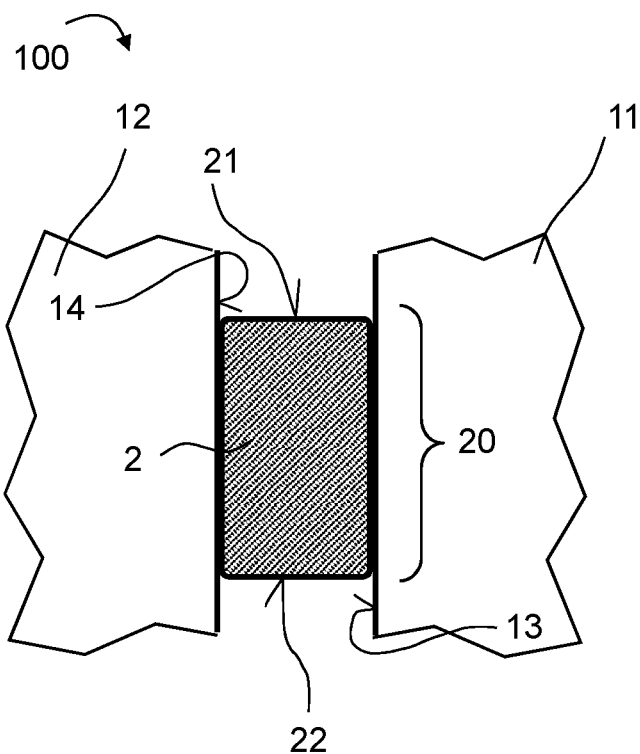
FIGS. 2A and 2B schematic illustrations of sections of a device according to further exemplary embodiments.
Figure 2B:
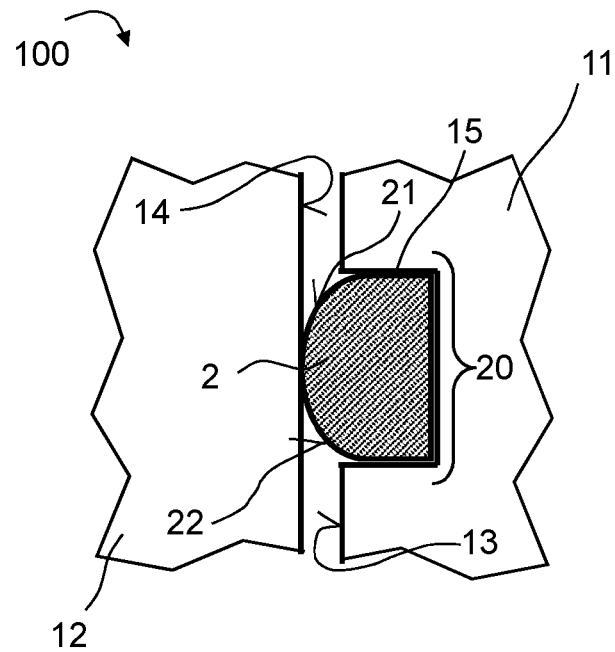

FIGS. 2A and 2B show sections of further exemplary embodiments for the device 100, corresponding to the section shown in FIG. 1B. As shown in FIG. 1B, the sealing element 2 can be a flat seal as an alternative to the previous exemplary embodiment. Furthermore, as shown in FIG. 2B, the sealing element 2 can also be formed as an injection-molded seal. For this purpose, it can be advantageous if at least one of the sealing surfaces 13, 14 comprises a groove 15 into which the sealing element 2 can be injected. Alternatively to the exemplary embodiment shown, both housing parts 11, 12 can also comprise a groove 15 in the corresponding sealing surface 13, 14. Furthermore, a groove in one or both sealing surfaces 13, 14 can also be advantageous in connection with a sealing element 2 formed as an O-ring, cord seal or flat seal.

The features and exemplary embodiments described in connection with the figures can be combined with each other in accordance with further exemplary embodiments, even if not all combinations are explicitly described. Furthermore, the exemplary embodiments described in connection with the figures can alternatively or additionally comprise further features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

The invention claimed is:

1. A device comprising:
a housing with at least a first housing part, a second housing part and an interior space at least partially surrounded by the first and second housing parts; and
a sealing element,
wherein the first housing part comprises a first sealing surface and the second housing part comprises a second sealing surface,
wherein the sealing element abuts the first sealing surface and the second sealing surface,
wherein the sealing element comprises an inner surface in contact with the interior space and an outer surface in contact with a surrounding atmosphere of the housing, and
wherein the sealing element comprises a gas permeable material through which gas is exchangeable between the interior space and the surrounding atmosphere.

2. The device according to claim 1, wherein the sealing element is impermeable to moisture and particles.

3. The device according to claim 1, wherein the sealing element comprises a plastic.

4. The device according to claim 1, wherein the sealing element comprises a porous material.

5. The device according to claim 1, wherein the sealing element comprises a porous rubber and/or porous polytetrafluoroethylene.

6. The device according to claim 1, wherein the sealing element comprises an O-ring, a cord seal, a flat seal or an injection-molded seal.

7. The device according to claim 1, wherein the device is configured to exchange the gas between the interior space and the surrounding atmosphere exclusively through the sealing element.

8. The device according to claim 1, wherein the housing is free of a ventilation opening configured to ventilate the interior space.

9. The device according to claim 1, wherein the first and second sealing surfaces are parts of an annular sealing area in which the sealing element is arranged.

10. The device according to claim 1, further comprising an electronic component in the interior space.

11. The device according to claim 10, wherein the electronic component comprises a sensor element.

12. The device according to claim 11, wherein the sensor element is a pressure sensor element.

13. A device comprising:
a housing with at least a first housing part, a second housing part and an interior space at least partially surrounded by the first and second housing parts;
a sealing element; and
an electronic component in the interior space,
wherein the first housing part comprises a first sealing surface and the second housing part comprises a second sealing surface,
wherein the sealing element abuts the first sealing surface and the second sealing surface,
wherein the sealing element comprises an inner surface in contact with the interior space and an outer surface in contact with a surrounding atmosphere of the housing,
wherein the sealing element comprises a gas permeable material through which gas is exchangeable between the interior space and the surrounding atmosphere,
wherein the device is configured to exchange the gas between the interior space and the surrounding atmosphere exclusively through the sealing element,
wherein the housing is free of a ventilation opening configured to ventilate the interior space, and
wherein the electronic component comprises a pressure sensor element.

14. The device according to claim 13, wherein the sealing element is impermeable to moisture and particles.

15. The device according to claim 13, wherein the sealing element comprises a plastic.

16. The device according to claim 13, wherein the sealing element comprises a porous material.

17. The device according to claim 13, wherein the sealing element comprises a porous rubber and/or porous polytetrafluoroethylene.

18. The device according to claim 13, wherein the sealing element comprises an O-ring, a cord seal, a flat seal or an injection-molded seal.

* * * * *